(12) United States Patent
Lei

(10) Patent No.: US 7,842,613 B1
(45) Date of Patent: Nov. 30, 2010

(54) METHODS OF FORMING MICROELECTRONIC PACKAGING SUBSTRATES HAVING THROUGH-SUBSTRATE VIAS THEREIN

(75) Inventor: Kuolung Lei, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 25 days.

(21) Appl. No.: 12/349,677

(22) Filed: Jan. 7, 2009

(51) Int. Cl.
*H01L 21/44* (2006.01)

(52) U.S. Cl. .................... 438/677; 438/51; 438/55; 438/64; 438/107; 438/411; 438/421; 438/597; 438/598; 438/618; 438/619; 438/666; 438/667; 438/674

(58) Field of Classification Search ............ 438/51, 438/55, 64, 107, 411, 421, 597–598, 618, 438/619, 666, 667, 674, 677
See application file for complete search history.

(56) References Cited

U.S. PATENT DOCUMENTS

| 6,928,879 | B2 | | 8/2005 | Partridge et al. | |
|---|---|---|---|---|---|
| 7,081,412 | B2 | | 7/2006 | Heschel | |
| 2005/0236562 | A1 | * | 10/2005 | Kuhmann et al. | 250/239 |
| 2006/0097388 | A1 | * | 5/2006 | Breitschwerdt et al. | 257/728 |
| 2006/0117551 | A1 | * | 6/2006 | Baumgartner et al. | 29/592.1 |
| 2006/0238067 | A1 | * | 10/2006 | Dausch | 310/311 |
| 2008/0223429 | A1 | * | 9/2008 | Everett et al. | 136/244 |
| 2008/0308920 | A1 | * | 12/2008 | Wan | 257/685 |
| 2009/0212407 | A1 | * | 8/2009 | Foster et al. | 257/686 |
| 2009/0256251 | A1 | * | 10/2009 | Getz et al. | 257/698 |

* cited by examiner

*Primary Examiner*—Kevin M Picardat
*Assistant Examiner*—Bac H Au
(74) *Attorney, Agent, or Firm*—Myers, Bigel, et al.

(57) ABSTRACT

Methods of forming a substrate for microelectronic packaging may include electroplating a metal seed layer onto a sidewall of a trench extending through the substrate. The sidewall may be patterned to have at least one slot therein that extends through the substrate. This slot is formed to be sufficiently narrow to block plating of the metal seed layer onto sidewalls of the slot. Thereafter, the at least a pair of electrodes are selectively electroplated onto side-by-side portions of the metal seed layer on the sidewall of the trench. During this electroplating step, the slot is used to provide a self-aligned separation between the pair of electrodes.

11 Claims, 5 Drawing Sheets

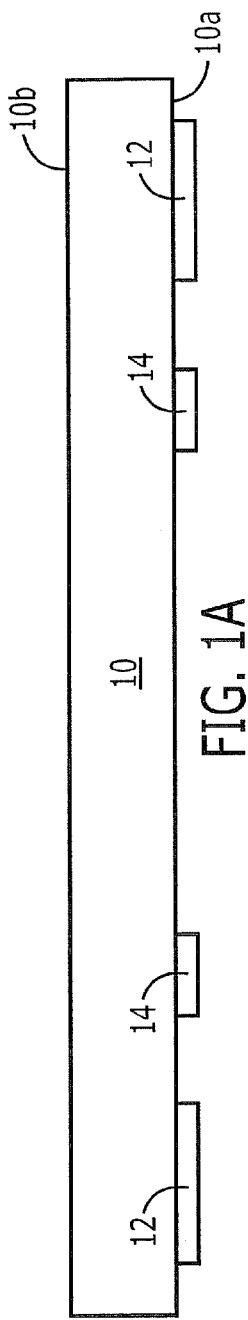
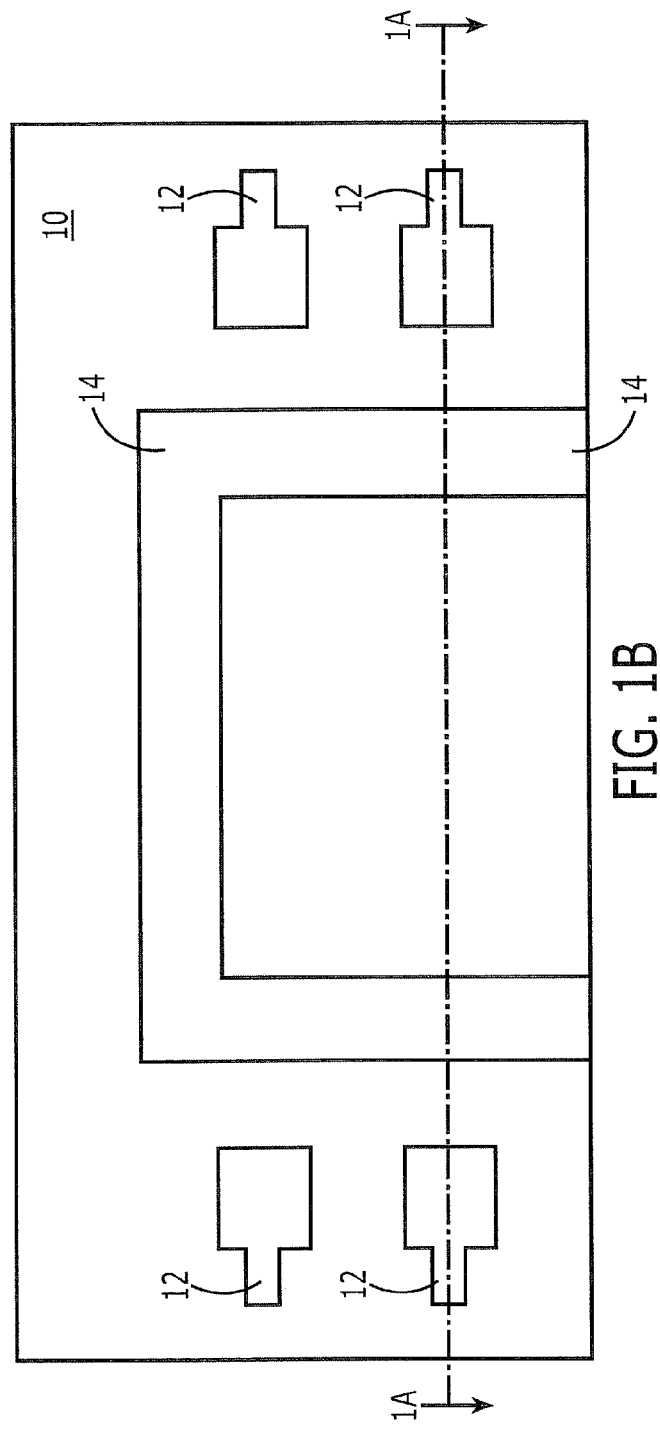

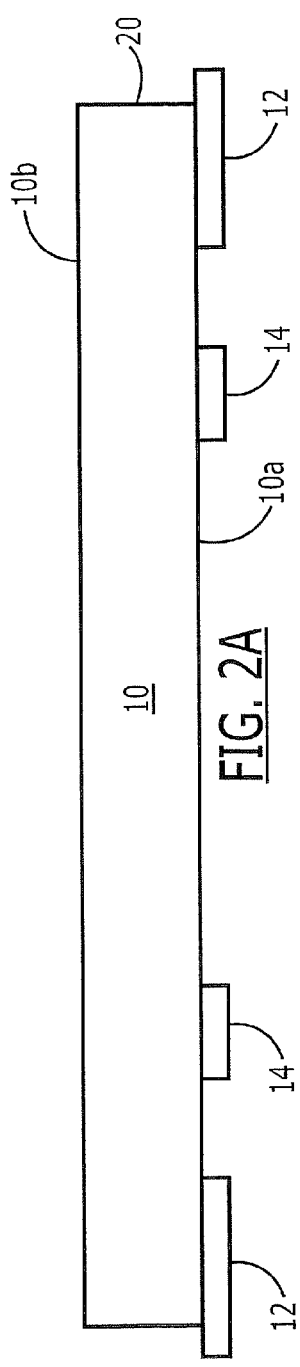
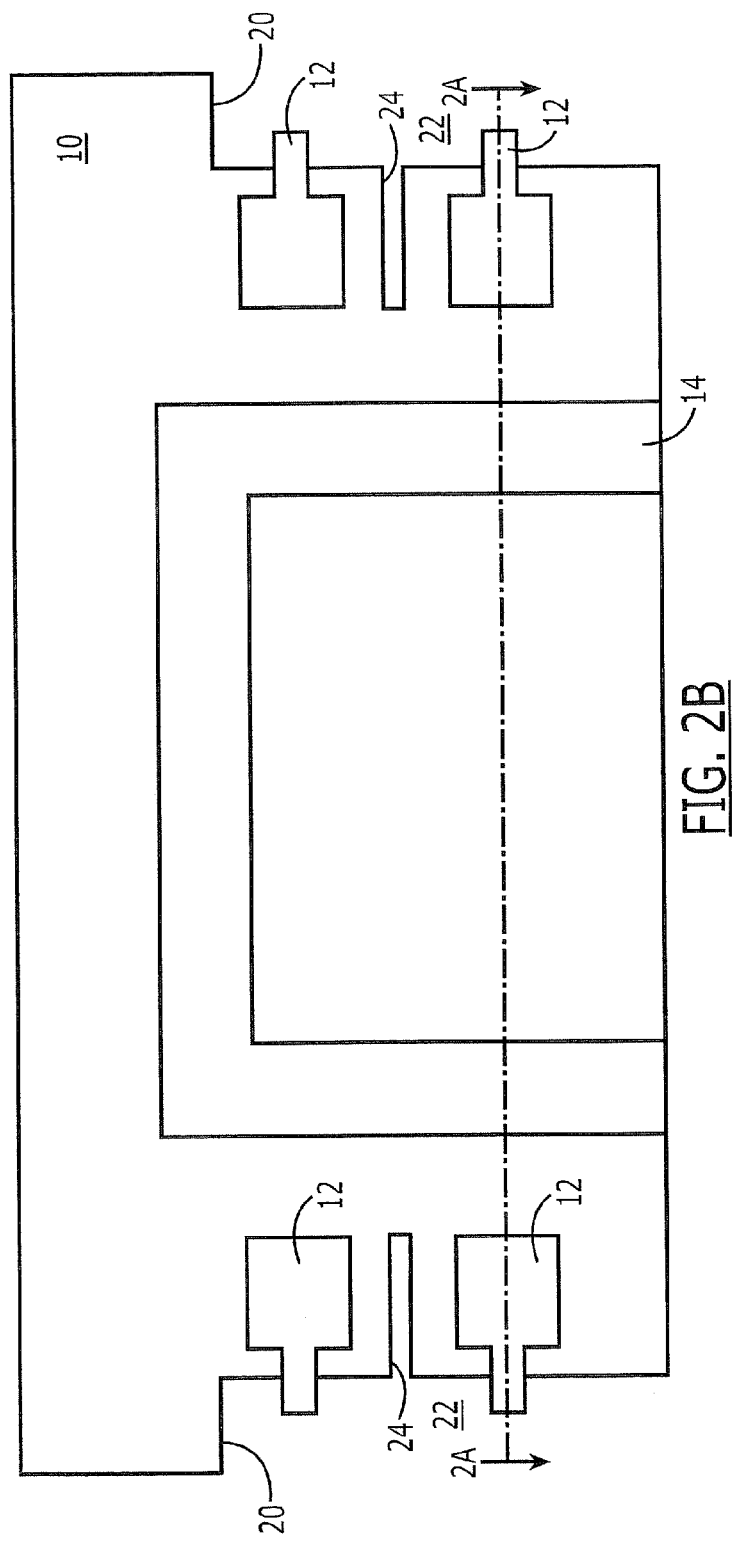

US 7,842,613 B1

METHODS OF FORMING MICROELECTRONIC PACKAGING SUBSTRATES HAVING THROUGH-SUBSTRATE VIAS THEREIN

FIELD OF THE INVENTION

The present invention relates to methods of packaging microelectronic devices and, more particularly, to methods of fabricating microelectronic circuit substrates used in packaging.

BACKGROUND OF THE INVENTION

Microelectronic circuits formed in integrated circuit chips are typically passivated using electrically insulating layers that are formed on the chips during back-end processing steps. These back-end processing steps may also include packaging the chips into a packaged integrated circuit device that protects the one or more chips from chemical contamination, thermal stresses, electrical and magnetic interference and other environmental influences. Notwithstanding these conventional techniques, there continues to be a need for improved packaging options for microelectronic circuits that may contain state-of-the-art devices, such as micro-electro-mechanical (MEMs) devices that can be more susceptible to contamination and other environmental influences.

SUMMARY OF THE INVENTION

Methods of forming substrates for microelectronic packaging according to some embodiments of the invention include electroplating a plurality of spaced-apart metal electrodes onto respective side-by-side portions of a sidewall of a substrate, which has a plurality of spaced-apart slots therein. These slots provide electrical isolation between the plurality of spaced-apart metal electrodes. In particular, the slots are sufficiently narrow to block electroplating of metal onto sidewalls of the slots.

Additional embodiments of the invention include forming a substrate having a plurality of electrically conductive signal pads on a first surface thereof and then selectively etching through a second surface of the substrate to: (i) define a through-substrate trench that exposes underlying portions of the electrically conductive signal pads, which may extend outwards relative to the etched sidewalls of the through-substrate trench; and (ii) define through-substrate slots that extend between respective pairs of the electrically conductive signal pads. Each of these through-substrate slots may have sidewalls that extend to the etched sidewalls of the through-substrate trench. A metal seed layer is then formed on the second surface of the substrate and on the etched sidewalls of the through-substrate trench. A selective electroplating step is then performed to define wraparound electrodes that extend onto the second surface, and onto the etched sidewalls of the trench and the underlying portions of the electrically conductive signal pads. Portions of the metal seed layer are then selectively removed from the second surface of the substrate, using the wraparound electrodes as removal masks.

According to further embodiments of the invention, the step of forming a substrate may include forming a substrate having a metal seal ring on the first surface and a plurality of electrically conductive signal pads on portions of the first surface that are outside a perimeter of the seal ring. The step of selectively electroplating wraparound electrodes may also be preceded by a step of patterning a resist layer onto the metal seed layer. The patterned resist layer may be used as a plating mask during the electroplating step. In particular, the resist layer may be patterned to define openings therein on the second surface that extend diametrically opposite the plurality of electrically conductive signal pads on the first surface.

Additional methods of forming a substrate for microelectronic packaging may include electroplating a metal seed layer onto a sidewall of a trench extending through the substrate. The sidewall may be patterned to have at least one slot therein that extends through the substrate. This slot is formed to be sufficiently narrow to block plating of the metal seed layer onto sidewalls of the slot. Thereafter, the at least a pair of electrodes are selectively electroplated onto side-by-side portions of the metal seed layer on the sidewall of the trench. During this electroplating step, the slot is used to provide a self-aligned separation between the pair of electrodes.

BRIEF DESCRIPTION OF THE DRAWINGS

FIGS. 1B-5B are plan views of intermediate structures that illustrate methods of forming substrates for microelectronic packaging, according to embodiments of the present invention.

FIG. 1A is a cross-sectional view of the intermediate structure of FIG. 1B, taken along line 1A-1A'.

FIG. 2A is a cross-sectional view of the intermediate structure of FIG. 2B, taken along line 2A-2A'.

DESCRIPTION OF PREFERRED EMBODIMENTS

Figure 3A:
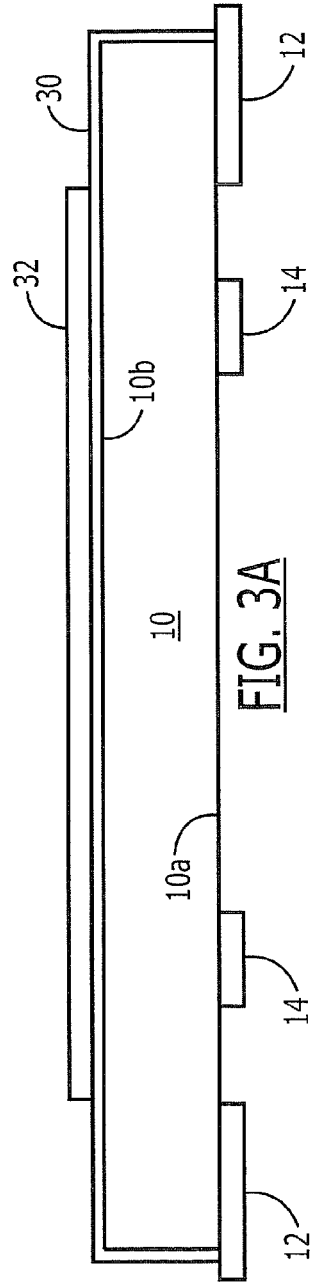
FIG. 3A is a cross-sectional view of the intermediate structure of FIG. 3B, taken along line 3A-3A'.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Methods of forming substrates for microelectronic packaging according to some embodiments of the invention include forming a substrate 10 having a plurality of electrically conductive signal pads 12 and a metal seal ring 14 on a first surface 10a thereof, as illustrated by FIGS. 1A-1B. As described herein, the substrate 10 may be used as a capping substrate having a first surface 10a that is bonded to an underlying substrate (not shown) to define a sealed microelectronic package. The substrate 10 may be formed as a semiconductor substrate (e.g., silicon wafer) or may be formed of another material or composite of substrate materials suitable for semiconductor processing. In particular, the substrate 10 may be formed of a material having a relatively high resistivity that provides effective electrical isolation between the plurality of spaced-apart signal pads 12. Alternatively, an electrically insulating layer (not shown) may be provided between the substrate 10 and the signal pads 12 in order to provide additional electrical isolation therebetween. Moreover, the metal seal ring 14 may be bonded to and provide a hermetic seal to the underlying substrate and the signal pads 12 may be electrically coupled to opposing signal pads (not shown) on the underlying substrate. According to some of these embodiments of the invention, the signal pads 12 and metal seal ring 14 may be formed using an electrochemical metal deposition technique, for example. The signal pads 12 and metal seal ring 14, which may be formed to have a thickness in a range from about 20 microns to about 675 microns, may be formed as a single metal layer or a composite of multiple metal layers (e.g., aluminum and copper), for example.

Referring now to FIGS. 2A-2B, a selective etching step is performed to define a plurality of through-substrate trenches 22 and a plurality of relatively narrow through-substrate slots 24 that extend to etched sidewalls 20 of the through-substrate trenches 22. As described more fully hereinbelow, the through-substrate slots 24 are formed to be sufficiently narrow to preclude electroplating of metal on sidewalls thereof during a subsequent electroplating step. Typically, a width of a through-substrate slot 24 should be sufficiently narrow so that a ratio of a thickness of the substrate 10 (i.e., depth of the slot 24) relative to the width of the slot 24 is greater than or equal to 10. According to some embodiments of the invention, the selective etching step may include performing deep reactive ion etching (DRIE) of a second surface 10b of the substrate 10. The trenches 22 are also defined so that underlying portions of the electrically conductive signal pads 12 are exposed. These exposed portions of the signal pads 12 are illustrated as tabs extending outwards relative to the etched sidewalls 20 of the through-substrate trenches 22.

Figure 3B:
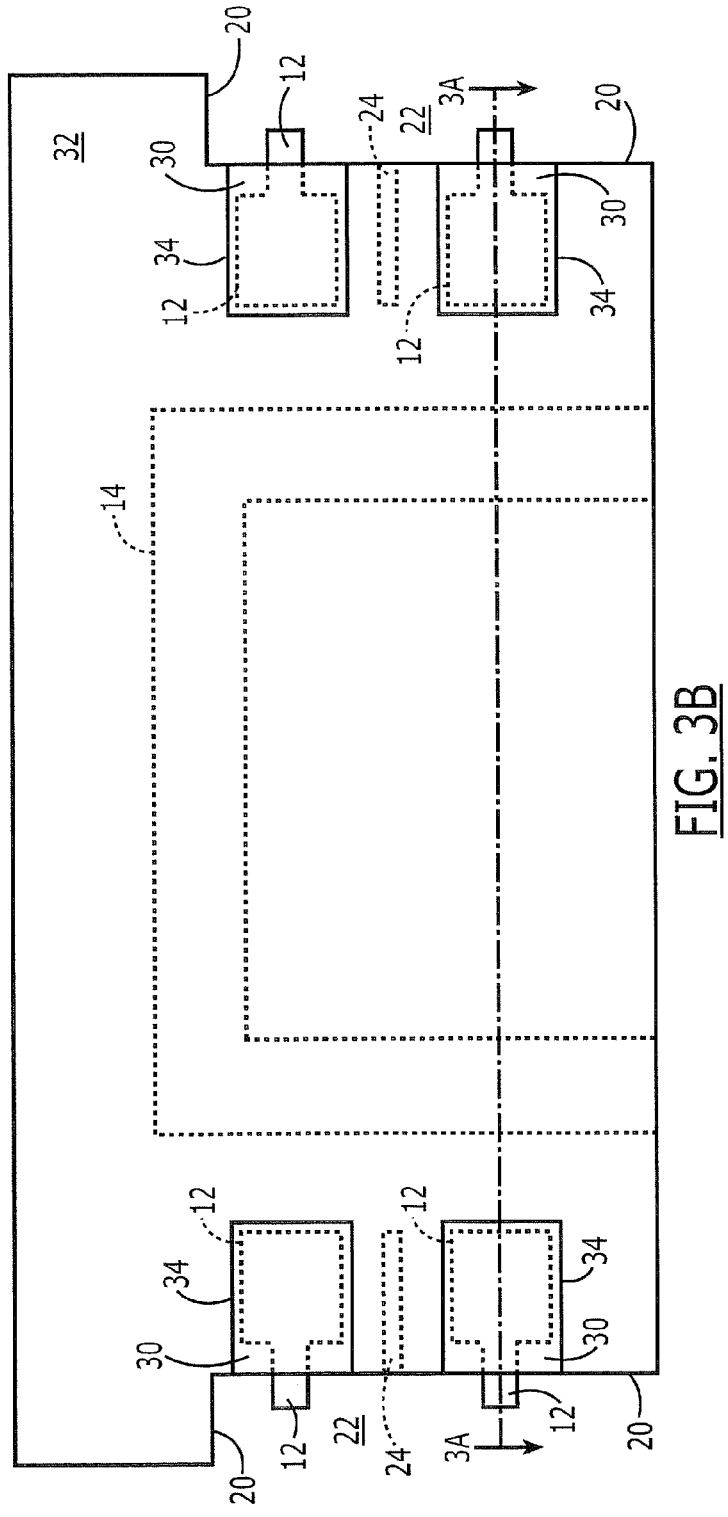

FIGS. 3A-3B illustrate the formation (e.g., deposition) of a metal seed layer 30 (e.g., by electrochemical deposition) directly on the second surface 10b of the substrate 10 and on the etched sidewalls 20 of the trenches 22. This metal seed layer 30 may be formed of a metal or metal alloy selected from a group consisting of titanium (Ti), titanium tungsten (TiW), copper (Cu) and gold (Au), for example. The relative narrowness of the through-substrate slots 24 preclude formation of the metal seed layer on sidewalls of the slots 24 and thereby prevent electrical shorting between the subsequently formed wraparound electrodes 40 illustrated by FIGS. 5A-5B. A patterned resist layer 32 is also formed on portions of the seed layer 30 extending opposite the second surface 10b. The resist layer 32 may be formed using a conventional technique, such as dry film resist (DFR) lamination lithography. As shown by FIG. 3B, the patterned resist layer 32 may be formed to have openings 34 therein that expose underlying portions of the metal seed layer 30. These openings 34 are illustrated as extending opposite respective signal pads 12 on an opposite side of the substrate 10.

Figure 4A:
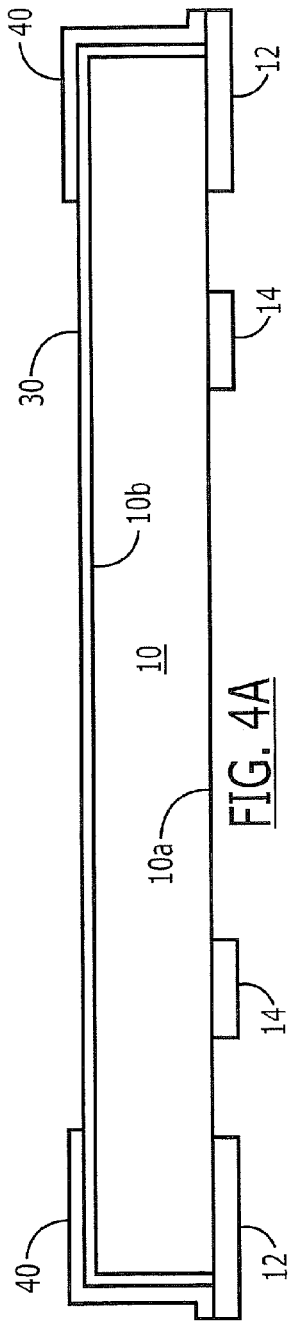
FIG. 4A is a cross-sectional view of the intermediate structure of FIG. 4B, taken along line 4A-4A'.
Figure 4B:
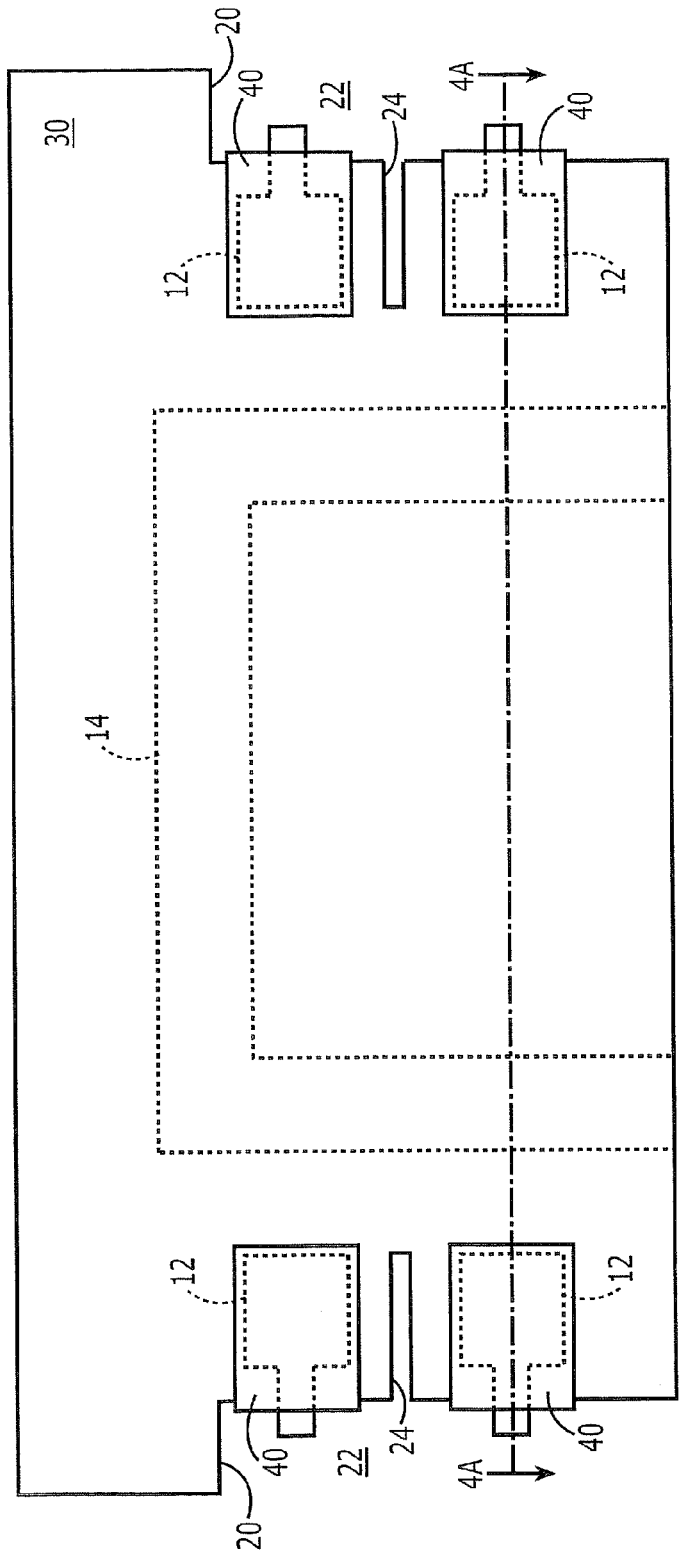
Figure 5A:
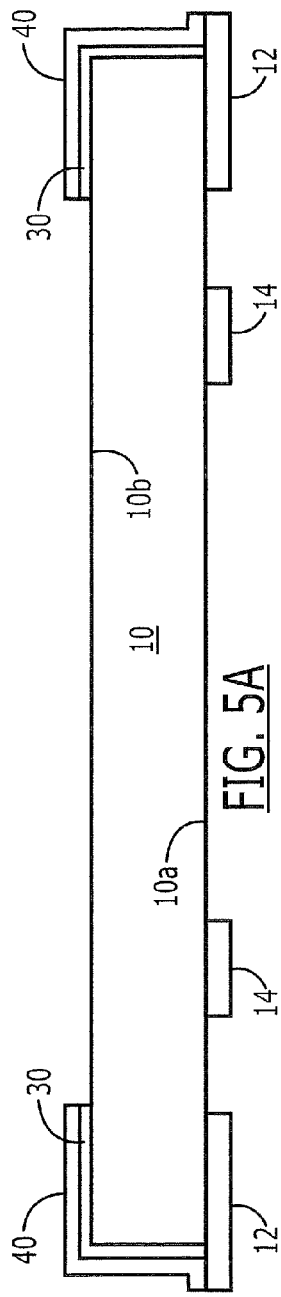
FIG. 5A is a cross-sectional view of the intermediate structure of FIG. 5B, taken along line 5A-5A'.
Figure 5B:
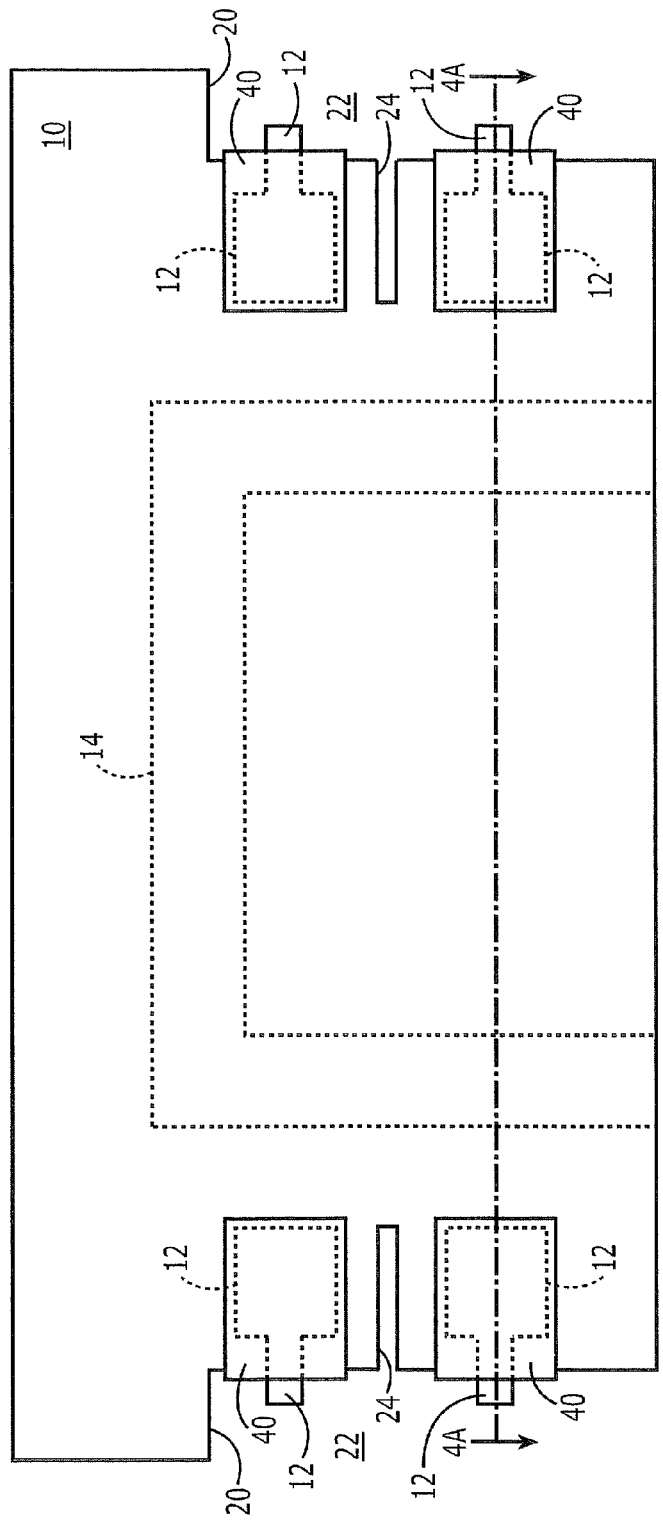

Referring now to FIGS. 4A-4B, a selective electroplating step (e.g., electrochemical deposition) is then performed to define wraparound electrodes 40 that extend onto the second surface 10b, and onto corresponding portions of the etched sidewalls 20 of the trenches 22 and the electrically conductive signal pads 12 extending outward from the etched sidewalls 20. The wraparound electrodes 40 (and underlying portions 30a of the seed layer 30) operate as respective through-substrate vias (TSVs), which are electrically connected to respective signal pads 12. Thereafter, as illustrated by FIGS. 5A-5B, portions of the metal seed layer 30 are selectively etched from the second surface 10b of the substrate 10, using the wraparound electrodes 40 as etching masks. The substrate 10 may then be bonded to an underlying substrate (not shown) and the trenches 22 may be filled with electrically insulating passivation material to thereby define a microelectronic package that may contain and protect internal microelectronic devices, such as micro-electromechanical (MEMs) devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a substrate for microelectronic packaging, comprising:

forming a substrate having a plurality of electrically conductive signal pads on a first surface thereof;

selectively etching through a second surface of the substrate to define a through-substrate trench that exposes underlying portions of the electrically conductive signal pads and also define through-substrate slots extending between respective pairs of the electrically conductive signal pads; then forming a metal seed layer on the second surface of the substrate; then selectively electroplating wraparound electrodes onto the second surface, etched sidewalls of the trench and onto the underlying portions of the electrically conductive signal pads; and selectively removing portions of the metal seed layer from the second surface of the substrate, using the wraparound electrodes as removal masks.

2. The method of claim 1, wherein said forming a substrate comprises forming a substrate having a metal seal ring on the first surface and a plurality of electrically conductive signal pads on portions of the first surface that are outside a perimeter of the seal ring.

3. The method of claim 1, wherein said selectively electroplating wraparound electrodes is preceded by patterning a resist layer on the metal seed layer; and wherein said selectively electroplating wraparound electrodes comprises selectively electroplating wraparound electrodes onto the metal seed layer, using the patterned resist layer as an electroplating mask.

4. The method of claim 3, wherein said forming a metal seed layer comprises forming a metal seed layer on the etched sidewalls of the trench.

5. The method of claim 1, wherein said forming a metal seed layer comprises forming a metal seed layer on the etched sidewalls of the trench.

6. The method of claim 1, wherein each of the through-substrate slots has sidewalls that extend to the etched sidewalls of the trench.

7. The method of claim 1, wherein said selectively electroplating wraparound electrodes is preceded by patterning a resist layer having openings that extend diametrically opposite the plurality of electrically conductive signal pads.

8. The method of claim 1, wherein said selectively etching comprises selectively etching through a second surface of the substrate to reveal underlying portions of the electrically conductive signal pads that extend outwards relative to the etched sidewalls of the trench.

9. A method of forming a substrate for microelectronic packaging, comprising:

electroplating a metal seed layer onto a sidewall of a trench extending through the substrate, said sidewall having a slot therein that extends through the substrate and is sufficiently narrow to block plating of the metal seed layer onto sidewalls of the slot; and selectively electroplating a pair of electrodes onto side-by-side portions of the metal seed layer on the sidewall of the trench, using the slot to define a self-aligned separation between the pair of electrodes.

10. The method of claim 9, wherein said step of selectively electroplating a pair of electrodes is preceded by a step of patterning a resist layer on the metal seed layer; and wherein said step of selectively electroplating a pair of electrodes comprises electroplating the pair of electrodes using the patterned resist layer as an electroplating mask.

11. A method of forming a substrate for microelectronic packaging, comprising:

electroplating a plurality of spaced-apart metal electrodes onto respective side-by-side portions of a sidewall of a substrate having a plurality of spaced-apart slots therein that are sufficiently narrow to thereby provide electrical isolation between the plurality of spaced-apart metal electrodes by blocking electroplating of metal onto sidewalls of the slots.

\* \* \* \* \*